United States Patent
Heller

(10) Patent No.: US 12,199,578 B2
(45) Date of Patent: Jan. 14, 2025

(54) AMPLIFIERS SUITABLE FOR MM-WAVE SIGNAL SPLITTING AND COMBINING

(71) Applicant: Ay Dee Kay LLC, Aliso Viejo, CA (US)

(72) Inventor: Tom Heller, Karmiel (IL)

(73) Assignee: Ay Dee Kay LLC, Aliso Viejo, CA (US)

( * ) Notice: Subject to any disclaimer, the term of this patent is extended or adjusted under 35 U.S.C. 154(b) by 828 days.

(21) Appl. No.: 17/338,526

(22) Filed: Jun. 3, 2021

(65) Prior Publication Data

US 2021/0320634 A1    Oct. 14, 2021

Related U.S. Application Data

(63) Continuation of application No. 16/453,033, filed on Jun. 26, 2019, now Pat. No. 11,057,011.

(Continued)

(51) Int. Cl.
*H03F 3/45* (2006.01)
*H03F 1/56* (2006.01)
*H03F 3/68* (2006.01)

(52) U.S. Cl.
CPC ......... *H03F 3/45094* (2013.01); *H03F 1/565* (2013.01); *H03F 3/68* (2013.01); *H03F 2200/216* (2013.01); *H03F 2200/222* (2013.01); *H03F 2200/42* (2013.01); *H03F 2200/451* (2013.01); *H03F 2203/45018* (2013.01);

(Continued)

(58) Field of Classification Search
CPC ........ H03F 3/45094; H03F 1/565; H03F 3/68; H03F 2200/216; H03F 2200/222; H03F 2200/42; H03F 2200/451; H03F 2203/45018; H03F 2203/45024;

(Continued)

(56) References Cited

U.S. PATENT DOCUMENTS 6,169,452 B1    1/2001   Popesu et al.
6,577,198 B1    6/2003   Bayruns (Continued)

OTHER PUBLICATIONS

Ta-Shun Chu et al., "An Integrated Ultra-Wideband Timed Array Receiver in 0.13 um CMOS Using a Path-Sharing True Time Delay Architecture," IEEE Journal of Solid-State Circuits, vol. 42, No. 12, Dec. 2007, pp. 2834-2850.

*Primary Examiner* — Andrea Lindgren Baltzell
*Assistant Examiner* — Jose E Pinero
(74) *Attorney, Agent, or Firm* — Steven Stupp

(57) ABSTRACT

An amplifier circuit couples one or more selectable input ports to one or more selectable output ports. The circuit includes N input transistors and M output transistors. Each input transistor has its base coupled to a respective input port node, its emitter coupled to ground, and its collector connected to an intermediate node. Each output transistor has its base coupled to a bias node, its emitter connected to the intermediate node, and its collector coupled to a respective output port nodes. Each input transistor enables the respective input port node when its base is biased. Each output transistor enables the respective output port node when its bias node is asserted. The base of the input transistor for each enabled port is biased to provide a quiescent current I0*m/n through that input transistor, where m is the number of enabled output ports and n is the number of enabled input ports.

10 Claims, 3 Drawing Sheets

Related U.S. Application Data

(60) Provisional application No. 62/830,083, filed on Apr. 5, 2019.

(52) U.S. Cl.
CPC ............. *H03F 2203/45024* (2013.01); *H03F 2203/45028* (2013.01); *H03F 2203/45352* (2013.01)

(58) Field of Classification Search
CPC . H03F 2203/45028; H03F 2203/45352; H03F 3/191; H03F 2203/45318; H03F 3/4508
USPC ........................................................ 330/253
See application file for complete search history.

(56) References Cited

U.S. PATENT DOCUMENTS

| | | | |
|---|---|---|---|
| 7,142,060 B1 | 11/2006 | Maeda | |
| 2010/0261440 A1* | 10/2010 | Corman | ............... H01Q 15/242 |
| | | | 343/756 |
| 2016/0099688 A1* | 4/2016 | Quaglietta | ............... H03F 3/245 |
| | | | 330/296 |
| 2019/0383901 A1 | 12/2019 | Elad et al. | |

\* cited by examiner

AMPLIFIERS SUITABLE FOR MM-WAVE SIGNAL SPLITTING AND COMBINING

CROSS REFERENCE TO RELATED APPLICATIONS

The present application is a continuation of U.S. application Ser. No. 16/453,033, filed 2019 Jun. 26 and titled "Amplifiers Suitable for mm-Wave Splitting and Combining" by inventor Tom Heller. This application is hereby incorporated herein by reference in its entirety.

BACKGROUND

Electromagnetic (EM) signal wavelengths in the millimeter range (10 mm to 1 mm; 30 GHz to 300 GHz) are particularly useful for forming cellular networks, communicating high bandwidth data, and radar. In particular, automotive radar systems employ millimeter-wave (mm-wave) signals because they enable narrow beamwidths to be achieved with reasonable antenna array dimensions (e.g., on the order of 10 mm). Whether for transmitting and receiving mm-wave signals via an antenna array, or for other mm-wave signal applications, it is often desirable to split signal power in a controlled fashion among multiple outputs or to combine signal power in a controlled fashion from multiple inputs. Ideally, the power splitter/combiner would provide a power splitting/combining distribution that can be adjusted dynamically while maintaining a high efficiency for all potential coupling arrangements.

Existing solutions are not adjustable or are inefficient. For example, Wilkinson power couplers (splitter/combiners) are often used to redistribute mm-wave signal power. However, a Wilkinson coupler appears lossless only when it is impedance-matched at all ports. Disabling one of the ports produces an impedance mismatch and loss of transfer efficiency at the other ports.

Single-pole-multiple-throw switches can efficiently route mm-wave power between one input and one selected output at a time, or between one selected input and one output at a time. However, if one port is coupled to multiple ports at a time, an impedance mismatch is introduced, causing a loss of transfer efficiency.

U.S. Pat. No. 6,577,198 ("Bayruns") teaches an active power splitter with impedance matching. The splitter uses a parallel arrangement of common emitter or cascode amplifiers augmented by feedback resistors to provide impedance matching and high port-to-port isolation. The splitter provides a fixed distribution of power among multiple outputs.

U.S. Pat. No. 7,142,060 ("Maeda") teaches an active splitter for multiple reception units. The active splitter uses two stages, with the first stage being a common-emitter or common-source voltage amplifier. Multi-stage solutions in general require undesirably high power consumption, and this solution in particular employs a first stage design that exhibits unacceptably high losses at mm-wave frequencies.

U.S. Pat. No. 9,537,214 ("Corman") teaches a multi-beam phased array architecture that provides a fixed distribution of power among multiple outputs and a fixed combination of power from multiple inputs.

SUMMARY

Accordingly, there are disclosed herein efficient amplifiers suitable for mm-wave power splitting and combining. In one illustrative embodiment, there is provided a split-steer amplifier circuit operable in a steer mode to couple an input port to a selected one of multiple output ports and in a split mode to couple the input port to each of the multiple output ports. The circuit includes an input transistor and multiple output transistors. The input transistor has its base or gate coupled to an input port node, its emitter or source coupled to ground, and its collector or drain connected to an intermediate node. Each of the multiple output transistors has its base or gate coupled to a bias node, its emitter or source connected to the intermediate node, and its collector or drain coupled to a respective one of multiple output port nodes. Each output transistor enables the respective one of the multiple output port nodes when its bias node is asserted and disables the respective one of the multiple output port nodes when its bias node is deasserted. The base or gate of the input transistor is biased to provide a first quiescent current $I_0$ through the input transistor when only one of the multiple output port nodes coupled to the intermediate node is enabled, and is biased to provide a second quiescent current $m*I_0$ when m of the multiple output port nodes coupled to the intermediate node are enabled, m being greater than one.

In another illustrative embodiment, there is provided a combine-steer amplifier circuit operable in a steer mode to couple a selected one of multiple input ports to an output port and in a combine mode to couple each of the multiple input ports to the output port. The circuit includes multiple input transistors and an output transistor. Each of the multiple input transistor has its base or gate coupled to a respective one of multiple input port nodes, its emitter or source coupled to ground, and its collector or drain connected to an intermediate node. The output transistor has its base or gate coupled to a bias node, its emitter or source connected to the intermediate node, and its collector or drain coupled to an output port node. Each input transistor enables the respective one of the multiple input port nodes when its base or gate is biased, and disables the respective one of the multiple input port nodes when its base or gate is grounded. The base or gate of each enabled input transistor is biased to provide a first quiescent current $I_0$ through the input transistor when only one of the multiple input port nodes coupled to the intermediate node is enabled, and is biased to provide a second quiescent current $I_0/n$ when n of the multiple output port nodes coupled to the intermediate node are enabled, n being greater than one.

In yet another illustrative embodiment, there is provided a multiple-input multiple-output amplifier circuit operable to couple each of a selected input port or a combination of input ports to each of a selected output port or a combination of output ports. The circuit includes N input transistors and M output transistors, M and N each being greater than one. Each of the input transistors has its base or gate coupled to a respective one of N input port nodes, its emitter or source coupled to ground, directly or via a degeneration resistor or inductor, and its collector or drain connected to an intermediate node. Each of the output transistors has its base or gate coupled to a bias node, its emitter or source connected to the intermediate node, and its collector or drain coupled to a respective one of M output port nodes. Each input transistor enables the respective input port node when its base or gate is biased and disables the respective input port node when its base or gate is grounded. Each output transistor enables the respective output port node when its bias node is asserted and disables the respective output port node when its bias node is deasserted. The base or gate of the input transistor for each enabled port is biased to provide a quiescent current $I_0*m/n$ through that input transistor, where m is the variable number of enabled output ports and n is the variable number of enabled input ports.

An illustrative method embodiment couples a selectable one of multiple input ports or a combination of said multiple input ports to a selectable one of multiple output ports or a combination of said multiple output ports. The illustrative method includes: (a) for each of the multiple input ports, coupling the base or gate of an input transistor to a corresponding input port node, an emitter or source of that input transistor to ground, and a collector or drain of that input transistor to an intermediate node; (b) for each of the multiple output ports, coupling the base or gate of an output transistor to a corresponding bias node, an emitter or source of that output transistor to the intermediate node, and the collector or drain of that output transistor to a corresponding output port node; (c) switchably coupling the bias nodes to a bias voltage and a ground, respectively, to enable and disable the corresponding output port node; (d) switchably biasing the base or gate of each input transistor to an adjustable bias voltage and a ground, respectively, to enable and disable the corresponding input port node; and (e) causing the adjustable bias voltage to provide an adjustable quiescent current through each enabled input transistor, the adjustable quiescent current being $I_0*m/n$, where m is the number of enabled output ports and n is the number of enabled input ports, m and n being variable.

Each of the foregoing embodiments may be employed together with any one or more of the following optional features: 1. m is variable between one and two. 2. n is variable between one and two. 3. the base or gate of each input transistor is capacitively coupled to the respective input port node. 4. a choke impedance supplies the biases for the first and second quiescent currents to the base or gate of each input transistor. 5. the choke impedance is an inductor or a resistor. 6. the intermediate node is a positive node, the input port node is a positive input port node, and the multiple output port nodes are positive output port nodes. 7. a second set or one or more input transistors each having its base or gate coupled to a respective negative input port node, its emitter or source coupled to ground directly or via a degeneration resistor or inductor, and its collector or drain connected to a negative intermediate node. 8. The set of input transistors is connected to the set of output transistors via a series inductor. 9. The set of input transistors is connected to the set of output transistors through a transformer. 10. a second set of one or more output transistors, each having its base or gate coupled to a bias node, its emitter or source connected to the negative intermediate node, and its collector or drain coupled to a respective negative output port nodes. 11. each output transistor in the second set enabling the respective negative output port node when its bias node is asserted and disabling the respective negative multiple output port nodes when its bias node is deasserted. 12. each input port accepting a differential input signal via corresponding positive and negative input port nodes, and each output ports supplying a differential output signal via corresponding positive and negative output port nodes. 13. each of the input and output transistors is an NPN bipolar junction transistor. 14. the adjustable quiescent current is configured to be one of $I_0/2$, $I_0$, $2I_0$, depending on the values of m and n.

It should be understood that the drawings and corresponding detailed description do not limit the disclosure, but on the contrary, they provide the foundation for understanding all modifications, equivalents, and alternatives falling within the scope of the appended claims.

DETAILED DESCRIPTION

To facilitate understanding, the following circuitry omits impedance matching networks and the sources for bias and supply voltages that, in accordance with common industry practice, would be present in any physical implementation but are familiar to those of ordinary skill in the art and have designs that are not impacted by the innovations disclosed herein.

Figure 1A:
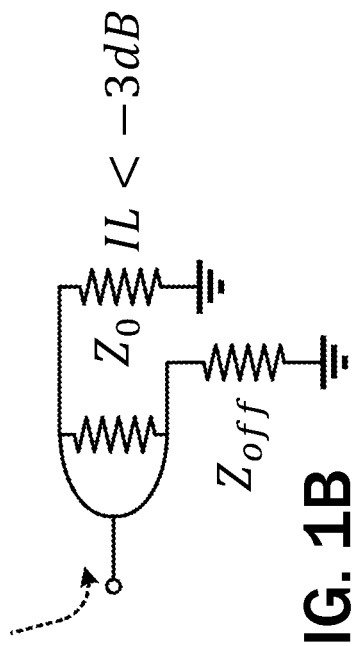
FIG. 1A is a schematic of a Wilkinson power coupler with balanced output ports.
Figure 1B:
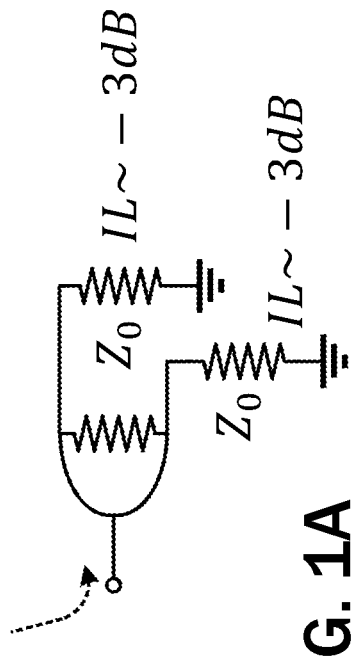
FIG. 1B is a schematic of a Wilkinson power coupler with a disabled output port.

FIG. 1A shows a Wilkinson power coupler that divides an input signal evenly between two output loads represented by load impedances $Z_0$. Typically, such couplers are implemented using quarter-wave microstrips or transmission lines to couple the input node to each output node, with a bridge impedance between the output nodes of $2Z_0$, but lumped-element implementations are also known. So long as the load impedances remain at $Z_0$, the input impedance $Z_{in}$ equals the load impedance $Z_0$. If the source impedance matches the input impedance $Z_{in}$, the input signal is transferred to the load impedances without reflection and minimal dissipation within the coupler itself, yielding a 3 dB attenuation ("insertion loss") for each output node. If, on the other hand, one of the loads is disabled such that its impedance rises to a large value $Z_{off}$, the coupler's input impedance rises to some value above $Z_0$ and causes an impedance mismatch. Rather than the input signal energy being transferred efficiently to the other output node, the attenuation increases, weakening the signal at the enabled output node.

Figure 1C:
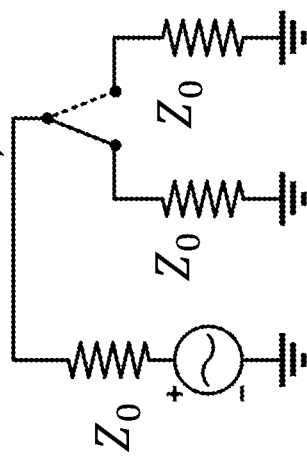
FIG. 1C is a schematic of a single-pole double-throw (SPDT) switch in a first position.
Figure 1D:
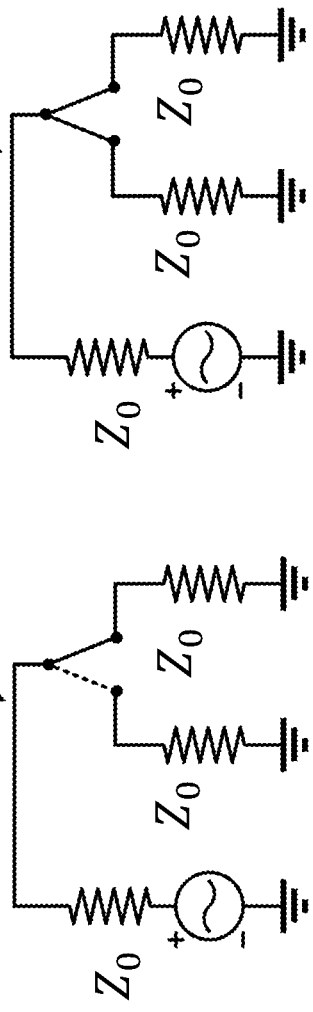
FIG. 1D is a schematic of a SPDT switch in a second position.
Figure 1E:
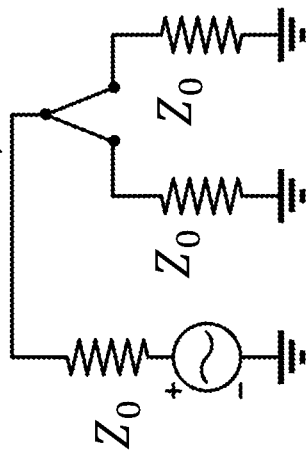
FIG. 1E is a schematic of a switch input coupled to two outputs.

FIG. 1C shows an ideal voltage source with a series impedance of $Z_0$, the Thevenin equivalent of a signal source with a source impedance of $Z_0$. A switch couples the source to a first load in FIG. 1C and a second load in FIG. 1D. In each case, the source impedance is matched to the load impedance, yielding an efficient transfer of signal energy to the load. If, however, the switch is configurable to couple the source to both loads in parallel as shown in FIG. 1E, the effective load impedance becomes $Z_0/2$. The impedance mismatch between the source and the effective load causes an inefficient transfer of signal energy.

Figure 2A:
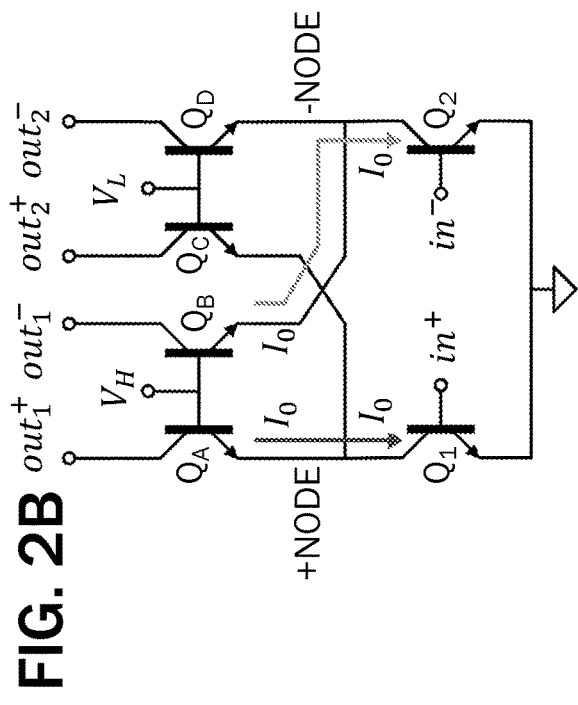
FIG. 2A is an illustrative split-steer amplifier in split-mode.

FIG. 2A shows a contemplated embodiment of a split-steer amplifier operating in split mode, i.e., a mode in which a signal from a single input port is distributed evenly to multiple output ports. The illustrated amplifier accepts a differential input signal (in+, in−) and supplies two differential output signals (out1+, out1−; out2+, out2−), but single-ended implementations can also be implemented as discussed further below.

A positive node (+Node) is the intermediate node in a cascode amplifier arrangement, with NPN transistor $Q_1$ in a common emitter configuration coupling the positive node to ground, and NPN transistors $Q_A$ and $Q_C$ each in a common base configuration to couple the positive node to the positive output nodes out1+ and out2+, respectively. Similarly, a negative node (−Node) is the intermediate node in a cascode amplifier arrangement, with NPN transistor $Q_2$ coupling the negative node to ground, and NPN transistors $Q_B$ and $Q_D$ each in a common base configuration to couple the negative node to negative output nodes out1− and out2−, respectively. Transistors $Q_A$ and $Q_B$ have a shared base node coupled to a high bias voltage $V_H$ to enable the first output port out1+, out1−. Similarly, transistors $Q_C$ and $Q_D$ have a shared base node coupled to the high bias voltage $V_H$ to enable the second output port out2+, out2−. The high bias voltage $V_H$ is chosen to permit transistors $Q_A$-$Q_D$ to operate in the linear region, i.e., without saturating when the input signal reaches the upper or lower limit of its expected range. Bias voltage $V_H$ can be provided in a number of ways familiar to those of ordinary skill in the art including, e.g., voltage divider, current mirror, Zener diode, and/or band-gap voltage reference.

The bases of transistors $Q_1$ and $Q_2$ are respectively coupled to the input port nodes in+, in−. The input port nodes are biased at one of two bias voltages such that when the input signal is quiescent, the current flow through each of the transistors $Q_1$-$Q_2$ is $I_0$ (for steer mode) or $2I_0$ (for split mode). For the split-mode operation shown in FIG. 2A, the input port nodes are biased for $2I_0$ to draw $I_0$ from each output node via transistors $Q_A$-$Q_D$. The split-steer amplifier amplifies the signal received on the input port, and distributes the amplified signal current evenly between the two output ports. The amplifier provides a high input impedance, a high output impedance, and high port-to-port isolation.

Figure 2B:
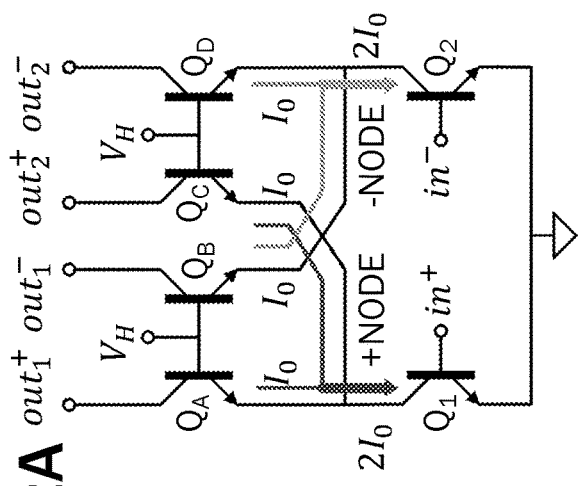
FIG. 2B is an illustrative split-steer amplifier in steer-mode.

FIG. 2B shows the split-steer amplifier operating in the steer mode. In the steer mode, one of the output ports (in this case, out2+, out2−) is disabled by grounding or sufficiently lowering the shared base node of the corresponding transistors $Q_C$, $Q_D$. The bias voltage on the input port nodes is reduced so that $I_0$ is drawn from each output node via transistors $Q_A$-$Q_B$. The amplifier amplifies the signal receive on the input port, supplying the amplified signal current to only the enabled output port. The input impedance and output impedance remain unchanged, preserving the input and output impedance matching and hence the efficiency of the power splitter while enabling selective distribution of the output signal current.

Figure 3:
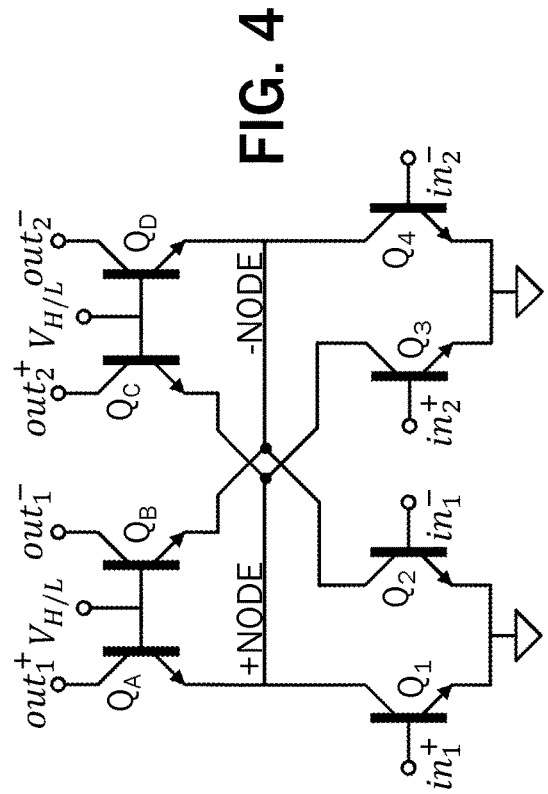
FIG. 3 is an illustrative combine-steer amplifier.

FIG. 3 shows a contemplated embodiment of a combine-steer amplifier which can operate in a combine mode to provide an output port with an amplified sum of signals received on multiple input ports, and in a steer mode to provide the output port with an amplified signal from a selected one of the multiple input ports. The illustrated amplifier accepts a first differential input signal at a first input port (in1+, in1−) and a second differential input signal at a second input port (in2+, in2−), and supplies a differential output signal at a single output port (out+, out−).

As before, the amplifier includes a positive node (+Node) as the intermediate node in a cascode amplifier arrangement, with NPN transistors $Q_1$ and $Q_3$ each in a common emitter configuration coupling the positive node to ground, and NPN transistor $Q_A$ in a common base configuration to couple the positive node to the positive output node out+. A negative node (−Node) is included as the intermediate node in a cascode amplifier arrangement, with NPN transistors $Q_2$ and $Q_4$ each coupling the negative node to ground, and NPN transistor $Q_B$ in a common base configuration to couple the negative node to negative output node out−. Transistors $Q_A$ and $Q_B$ have a shared base node coupled to a high bias voltage $V_H$ to enable the output port. Similarly, transistors $Q_C$ and $Q_D$ have a shared base node coupled to the high bias voltage $V_H$ to enable the second output port out2+, out2−. The high bias voltage $V_H$ is chosen to permit transistors $Q_A$-$Q_D$ to operate in the linear region, i.e., without saturating when the sum of input signals reaches the upper or lower limit of its expected range.

The bases of transistors $Q_1$ and $Q_2$ are respectively coupled to the first input port's nodes in1+, in1−, while bases of transistors $Q_3$ and $Q_4$ are respectively coupled to the second input port's nodes in2+, in2−. The input port nodes are each biased at one of two bias voltages such that when the input signals are quiescent, the current flow through each of the transistors $Q_1$-$Q_4$ is $I_0/2$ (for combine mode) or $I_0$ (for the enabled input port transistors in steer mode). For the combine-mode operation, the input port nodes are biased for $I_0/2$ to draw $I_0$ from each output node via transistors $Q_A$-$Q_B$. The combine-steer amplifier amplifies the signals received on the input ports, and draws the sum of the amplified signal currents from the output port nodes. The amplifier provides a high input impedance, a high output impedance, and high port-to-port isolation.

In the steer-mode, one of the input ports is disabled by grounding the base nodes of the corresponding transistors $Q_1$, $Q_2$ or $Q_3$, $Q_4$. The bias on the transistors for the input port is increased so that $I_0$ is drawn from each output node via transistors $Q_A$-$Q_B$. The amplifier amplifies the signal receive on the selected input port, supplying the amplified signal current to the output port. The input impedance and output impedance remain unchanged, preserving the input and output impedance matching and hence the efficiency of the power splitter while enabling selective distribution of the output signal current.

Figure 4:
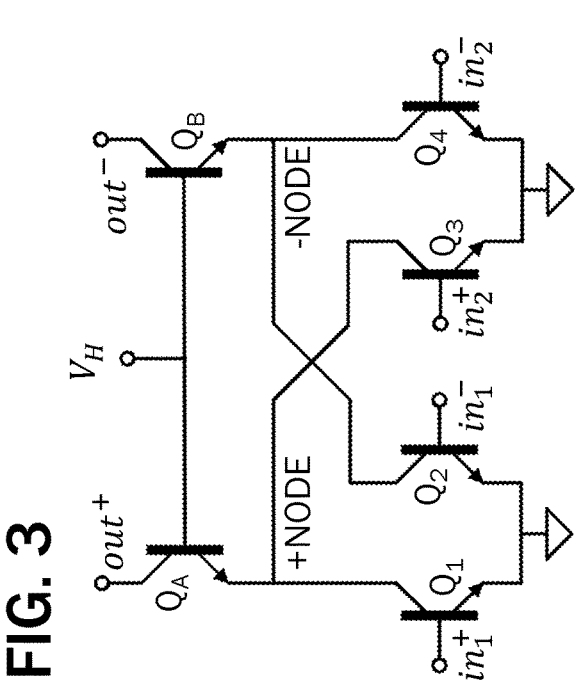
FIG. 4 is an illustrative multi-input multi-output (MIMO) amplifier.

FIG. 4 shows a contemplated embodiment of a MIMO amplifier, which combines the functionality of the split-steer amplifier with the combine-steer amplifier and enables a selected one of the input signals, or a sum of the input signals to be provided to a selected output port or split between both output ports. The bias voltage on the input nodes changes depending on the number of selected input and output ports to assure that a predetermined current level $I_0$ is drawn from each enabled output port. The MIMO amplifier provides a high input impedance and a high output impedance to assure impedance matching and efficient operation in each mode.

Figure 5:
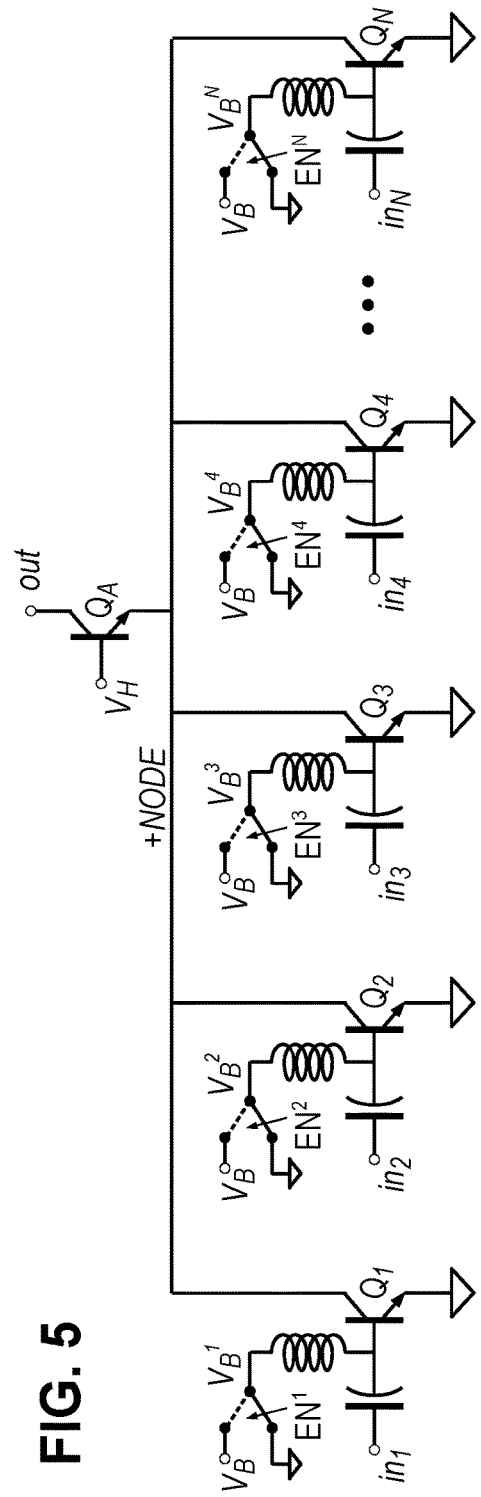
FIG. 5 is an illustrative single-ended N:1 combine-steer amplifier.

FIG. 5 shows a contemplated embodiment of a single-ended N:1 combine-steer amplifier to demonstrate how the foregoing principles can be extended to an arbitrary number of input ports (and similarly for split-steer and MIMO amplifiers, to an arbitrary number of output ports) subject to routing limits for the bias voltage network and intermediate nodes, as well as process limits for assuring matched behavior of the various transistors. FIG. 5 also provides additional detail for one possible technique for biasing the base nodes of the common-emitter configured transistors $Q_1$-$Q_N$. Each input port node in1-inN is capacitively coupled to the base of a respective NPN transistor $Q_1$-$Q_N$, which has its emitter directly coupled to ground and its collector directly coupled to the intermediate node (+Node). Each NPN cascode transistor $Q_A$ has its emitter coupled to the intermediate node, its collector coupled to the respective output node out, and its base coupled to a bias voltage $V_H$ (when enabled) or $V_L$ (when disabled).

Each base node of the common-emitter configured transistors $Q_1$-$Q_N$ is supplied with a respective bias voltage $V_B1$-$V_BN$ via a choke inductor. For disabled input ports, the bias voltage is grounded. For enabled input ports, the bias voltage depends on the number of enabled input and output ports. Where N is the number of enabled input ports and M is the number of enabled output ports, the bias voltages for the enabled input ports are set to provide a quiescent current draw of $(M/N)I_0$ from the intermediate node, so that the quiescent current flow from each output node is $I_0$.

Figure 6:
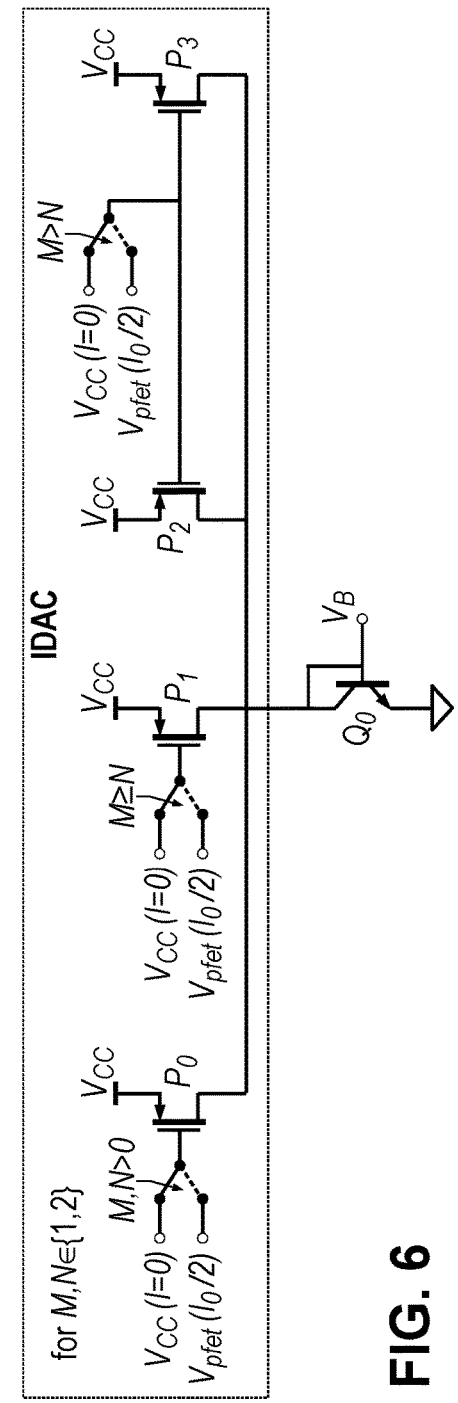
FIG. 6 shows an illustrative IDAC (digital-to-analog current converter).

We note here that the bias current of each common-emitter configured transistor may be controlled using a simple current mirror and an IDAC (digital-to-analog current converter) as shown, for example, in FIG. 6.

In the claims, transistors $Q_1$, $Q_2$, $Q_3$, $Q_4$, ..., $Q_N$, may be referred to as "input transistors" since they couple the input nodes to the intermediate nodes. Transistors $Q_A$, $Q_B$, $Q_C$, $Q_D$, ..., $Q_M$, may be referred to as "output transistors" since they couple the intermediate nodes to the output nodes. The term "connected" means a direct electrical connection, i.e., attached with a fixed path having negligible electrical impedance. The term "coupled" means that an electrical signal can be conveyed, but that the path of conveyance may be temporary (i.e., switchable) or may include intermediate components having a non-negligible electrical impedance.

The foregoing amplifiers enable flexible signal splitting and combining in a fashion that preserves impedance matching for each combination of selectable input and output ports (assuming that at least one input and one output port are enabled). They can be used to avoid amplitude and phase imbalances that might otherwise occur if a faulty antenna element or sub-array is disabled in a phased array system. They are also useful for implementing path-sharing time delay-based arrays (analog arrays in which the relative time delay between elements can be changed by switching the output of one element from a conventional RF splitting/combining network to the time delay circuit of its neighbor) as described in, e.g., "An Integrated Ultra-Wideband Timed Array Receiver in 0.13 um CMOS Using a Path-Sharing True Time Delay Architecture", JSSC 2007. Another potential use of such amplifiers is a dual-mode mixer, which may be used in shared-IF hybrid beamformers. Dual mode mixers have 2 differential local oscillator (LO) inputs. In single-balanced mode the mixer requires routing a selected LO source to one of its output ports (the other port should not receive any LO power), while in double-balanced mode the mixer requires splitting the LO source to both output ports.

The illustrated embodiments are implemented using NPN bipolar junction transistors, which can be provided using, e.g., a BiCMOS process. However, those of ordinary skill will recognize how to adapt the implementation to use other transistor technologies where permitted by the design specifications, including such technologies as PNP bipolar junction transistors, MOSFET, FINFET, JFET, and CMOS technologies in not only silicon, but also other semiconducting materials. If any of the FET technologies are used, the industry terminology for the common emitter configured transistor is a "common source" configured transistor, and for the common-base configured transistor it is a "common gate" configured transistor. As previously mentioned, the illustrated embodiments can be converted from differential signals to single-ended signals, and the number of input ports and/or output ports can be readily increased. These and numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. A method of coupling an input port to a selected one of multiple output ports or, in a split mode, to each of the multiple output ports, the method comprising:
    coupling a base or gate of an input transistor to an input port node, its emitter or source to ground, and its collector or drain to an intermediate node;
    for each of the multiple output ports, coupling a base or gate of an output transistor to a corresponding bias node, an emitter or source of that output transistor to the intermediate node, and a collector or drain of that output transistor to a corresponding output port node;
    switchably coupling the bias nodes to a bias voltage and a ground, respectively, to enable and disable the corresponding output port node; and
    coupling an adjustable bias voltage to the base or gate the input transistor, the adjustable bias voltage providing a first quiescent current lo through the input transistor when only one of the multiple output port nodes is enabled, and to provide a second quiescent current m*I0 when m of the multiple output port nodes are enabled in the split mode, m being greater than one.

2. The method of claim 1, wherein m equals two.

3. The method of claim 1, wherein the base or gate of the input transistor is capacitively coupled to the input port node, the method further comprising supplying the biases for the first and second quiescent currents to the base or gate of the input transistor via a choke impedance.

4. The method of claim 3, wherein the choke impedance is an inductor.

5. The method of claim 1, wherein the intermediate node is a positive node, the input port node is a positive input port node, and the multiple output port nodes are positive output port nodes, and wherein the method further comprises:
    coupling a base or gate of a second input transistor to a negative input port node, coupling its emitter or source to ground, and coupling its collector or drain to a negative intermediate node;
    for each of the multiple output nodes, coupling a base or gate of a second output transistor to a bias node, coupling its emitter or source to the negative intermediate node, and coupling its collector or drain to a corresponding one of multiple negative output port nodes,
    said switchably coupling including selectably asserting and deasserting the bias nodes for the second output transistors to respectively enable and disable the corresponding one of the multiple negative output port nodes,
    the input port accepting a differential input signal via the positive and negative input port nodes, and each of the multiple output ports supplying a differential output signal via corresponding ones of the positive and negative output port nodes.

6. A method of coupling a selectable one of multiple input ports or a combination of said multiple input ports to an output port, the method comprising:
    for each of the multiple input ports, coupling a base or gate of an input transistor to a corresponding input port node, an emitter or source of that input transistor to ground, and a collector or drain of that input transistor to an intermediate node;

coupling a base or gate of an output transistor to a bias node, its emitter or source to the intermediate node, and its collector or drain to an output port node;

switchably coupling the bias node to a bias voltage and ground to respectively enable and disable the output port node;

switchably biasing the base or gate of each input transistor to an adjustable bias voltage and a ground to respectively enable and disable the corresponding input port node; and causing the adjustable bias voltage to provide an adjustable quiescent current through each enabled input transistor, the adjustable quiescent current being $I0n$ where n is the number of enabled input ports.

7. The method of claim 6, wherein N equals two.

8. The method of claim 6, wherein the base or gate of each input transistor is capacitively coupled to the input port node, the method further comprising suppling the biases for the first and second quiescent currents via a choke impedance.

9. The method of claim 8, wherein the choke impedance is an inductor.

10. The method of claim 7, wherein the intermediate node is a positive node, the multiple input port nodes are positive input port nodes, and the output port node is a positive output port node, and wherein the method further comprises:

for each of the multiple input ports, coupling a base or gate of a second input transistor to a respective one of multiple negative input port nodes, its emitter or source to ground, and its collector or drain to a negative intermediate node;

coupling a base or gate of a second output transistor to a bias node, its emitter or source to the negative intermediate node, and its collector or drain to a negative output port node, said switchably biasing including biasing the bases or gates of the second input transistors to the adjustable bias voltage and a ground to respectively enable and disable the corresponding negative input port node, each of the multiple input ports accepting a differential input signal via corresponding ones of the positive and negative input port nodes, and the output port supplying a differential output signal the positive and negative output port nodes.

\* \* \* \* \*